United States Patent
Psyk et al.

(10) Patent No.: US 6,274,804 B1
(45) Date of Patent: *Aug. 14, 2001

(54) THIN-FILM SOLAR MODULE

(75) Inventors: Walter Psyk, Munich; Peter Lechner, Vaterstetten, both of (DE)

(73) Assignee: Angewandte Solarenergie - ASE GmbH, Alzenau (DE)

( * ) Notice: Subject to any disclaimer, the term of this patent is extended or adjusted under 35 U.S.C. 154(b) by 0 days.

This patent is subject to a terminal disclaimer.

(21) Appl. No.: 09/421,049

(22) Filed: Oct. 19, 1999

(30) Foreign Application Priority Data

Jul. 28, 1999 (DE) ................................. 199 37 384

(51) Int. Cl.[7] ............... H01L 27/142; H01L 31/042; H01L 31/05
(52) U.S. Cl. .................. 136/249; 136/244; 136/256; 136/257; 257/443; 257/448; 257/431; 257/435
(58) Field of Search ............... 136/244, 249 TJ, 136/256, 257, 249 MS; 257/443, 448, 431, 435

(56) References Cited

U.S. PATENT DOCUMENTS

| | | | |
|---|---|---|---|
| 4,638,109 | 1/1987 | Ishihara et al. | 136/244 |
| 4,933,022 | 6/1990 | Swanson | 136/249 |
| 5,041,391 | 8/1991 | Ono | 438/80 |
| 5,248,346 | 9/1993 | Fraas et al. | 136/244 |
| 5,616,185 | 4/1997 | Kukulka | 136/244 |
| 6,013,870 | * 1/2000 | Psyk et al. | 136/249 |

FOREIGN PATENT DOCUMENTS

| | | |
|---|---|---|
| 35 17 414 A1 | 11/1985 | (DE) . |
| 4039945 C2 | * 8/1994 | (DE) . |
| 19803326 C1 | * 6/1999 | (DE) . |
| 0 427 934 | 5/1991 | (EP) . |
| 0 749 161 A2 | 12/1996 | (EP) . |
| 0 768 720 | 4/1997 | (EP) . |
| 2 639 475 | 5/1990 | (FR) . |
| 63-228766 | 9/1988 | (JP) . |
| 9-64397 | 3/1997 | (JP) . |

OTHER PUBLICATIONS

Patent Abstracts of Japan, abstract for JP 02–298080, dated Dec. 10, 1990 (1 page).

* cited by examiner

*Primary Examiner*—Alan Diamond
(74) *Attorney, Agent, or Firm*—Flynn, Thiel, Boutell & Tanis, P.C.

(57) ABSTRACT

A thin-film solar module consists of a number of solar cells tandem mounted and series-connected on a common substrate and a number of diodes disposed antiparallel and adjacent thereto. Overlap zones are formed by a projecting edge area of an electrode layer of a solar cell or diode engaging a recess of the corresponding electrode layer of the adjacent diode or solar cell. Each diode is connected in the reverse direction with the adjacent solar cell in at least two overlap zones, the front electrode layer of the diode with the back electrode layer of the solar cell in at least one of said overlap zones, and the back electrode layer of the diode with the front electrode layer of the solar cell in at least one other overlap zone. The photovoltaically active layer sequence is additionally separated by grooves in areas of the grooves of the back electrode layer.

18 Claims, 6 Drawing Sheets

THIN-FILM SOLAR MODULE

FIELD OF THE INVENTION

This invention relates to a thin-film solar module.

BACKGROUND OF THE INVENTION

A solar module known from DE 198 03 326/U.S. Pat. No. 6,013,870 contains a number of solar cells tandem mounted and series-connected on a common substrate. The module also includes a number of adjacent diodes, also referred to as bypass diodes, likewise tandem mounted and connected in series but antiparallel to the solar cells on the same substrate. The structure consists for example of a glass wafer as the substrate, the front electrode layer deposited thereon, the photovoltaically active layer sequence located thereon, and the subsequently applied back electrodes (See FIG. 3 of DE 198 03 326/U.S. Pat. No. 6,013,870). The substrate and front electrode layer are transparently designed so that sunlight can penetrate into the photovoltaically active layers through said structure in order to produce the necessary mobile electric charge carriers. This is known as a superstrate structure.

The solar module can also be constructed as follows. On the substrate (e.g. a glass wafer) the back electrode layer is first deposited, then the photovoltaically active layer sequence, and subsequently the front electrode layer. In this case sunlight penetrates into the photovoltaically active layers through the last-named layer, which is now transparently designed. This module structure is called a substrate structure In a module according to DE 198 03 326/U.S. Pat. No. 6,013,870, an electric connection is present between a bypass diode and adjacent solar cell by reason of an electric conductivity (transverse conductivity) of the photovoltaically active layer sequence. Then the front and back electrode layers of the diode and its adjacent solar cell are interconnected by a direct electric contact. Consequently, the electric power of the solar module is reduced. This effect can occur because the photovoltaically active layer is not separated in the area of the separation of the front or back electrode layer in the grooves and of this module.

In the above-described module, the bypass diodes are also not covered upon incidence of light on the side facing the light and thus reduce the power of the solar cell by reason of their opposite polarity to the cell. The produced photocurrent of the solar cell is reduced by the amount of the photocurrent of the bypass diode.

SUMMARY OF THE INVENTION

The invention provides a solar module which can be produced using integrated thin-film technology, has a diode connected in the reverse direction for each individual solar cell (see DE 198 03 326/U.S. Pat. No. 6,013,870). The solar module avoids power losses caused by the transverse conductivity between the diode and the adjacent cell due to the photoactive layer sequence. A further object of the invention is that it prevents power loss of the solar module arising from the illuminated bypass diodes by an opaque mask of the bypass diodes. This is accomplished by means of a lacquering or screen print on the front glass wafer.

It is accordingly first provided that the front and back electrode layers of adjacent diodes are not electrically contacted directly with each other. This eliminates the direct series connection of the diodes. Further, overlap zones are formed by a projecting edge area of an electrode layer of a solar cell or diode engaging a recess of the corresponding electrode layer of the adjacent diode or solar cell and thus overlapping the superjacent or subjacent zone of the other electrode layer of said adjacent diode or solar cell. Finally, each diode is connected in the reverse direction with the adjacent solar cell in at least two overlap zones. Specifically, the front electrode layer of the particular diode is electrically contacted with the back electrode layer of the particular solar cell in at least one of said overlap zones. Also, the back electrode layer of said diode is electrically contacted with the front electrode layer of said solar cell in at least one other of said overlap zones.

The abovementioned overlap zones can be produced in simple, time-saving and cost-effective fashion in the course of the integrated industrial process by corresponding structuring of the particular electrode layers, as will become clearer below with reference to the embodiments. The contacting in the overlap areas also ensures firstly that each individual solar cell has assigned thereto a diode connected in the reverse direction thereto. Secondly, it causes the diodes to be series-connected altogether but in the reverse direction to the solar cells. While the series connection of the solar cells is effected directly in the usual way, i.e. by contacting the front electrode layer of a solar cell with the back electrode layer of the adjacent cell, the series connection of the diodes is effected by indirect means via the overlap zones and the electrode layers of the assigned solar cells.

To prevent each diode from being electrically short-circuited with its adjacent solar cell by a shunt resistance, represented by the transverse conductivity of the photovoltaically active layer sequence, the photovoltaically active layer sequence is removed between diode and solar cell.

BRIEF DESCRIPTION OF THE DRAWINGS

In the following, two embodiments (substrate and superstrate technology) of the invention will be explained in more detail with reference to the schematic figures, in which.

For superstrate technology.

For substrate technology.

DETAILED DESCRIPTION

Figure 2:
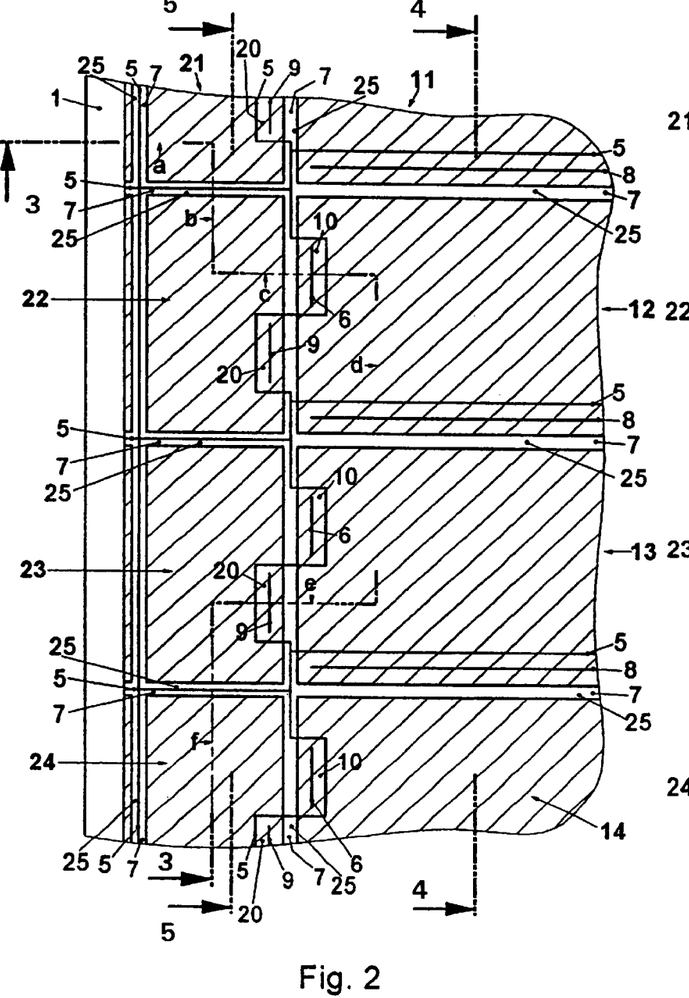
FIG. 2 shows part of the solar module in a plan view.
Figure 9:
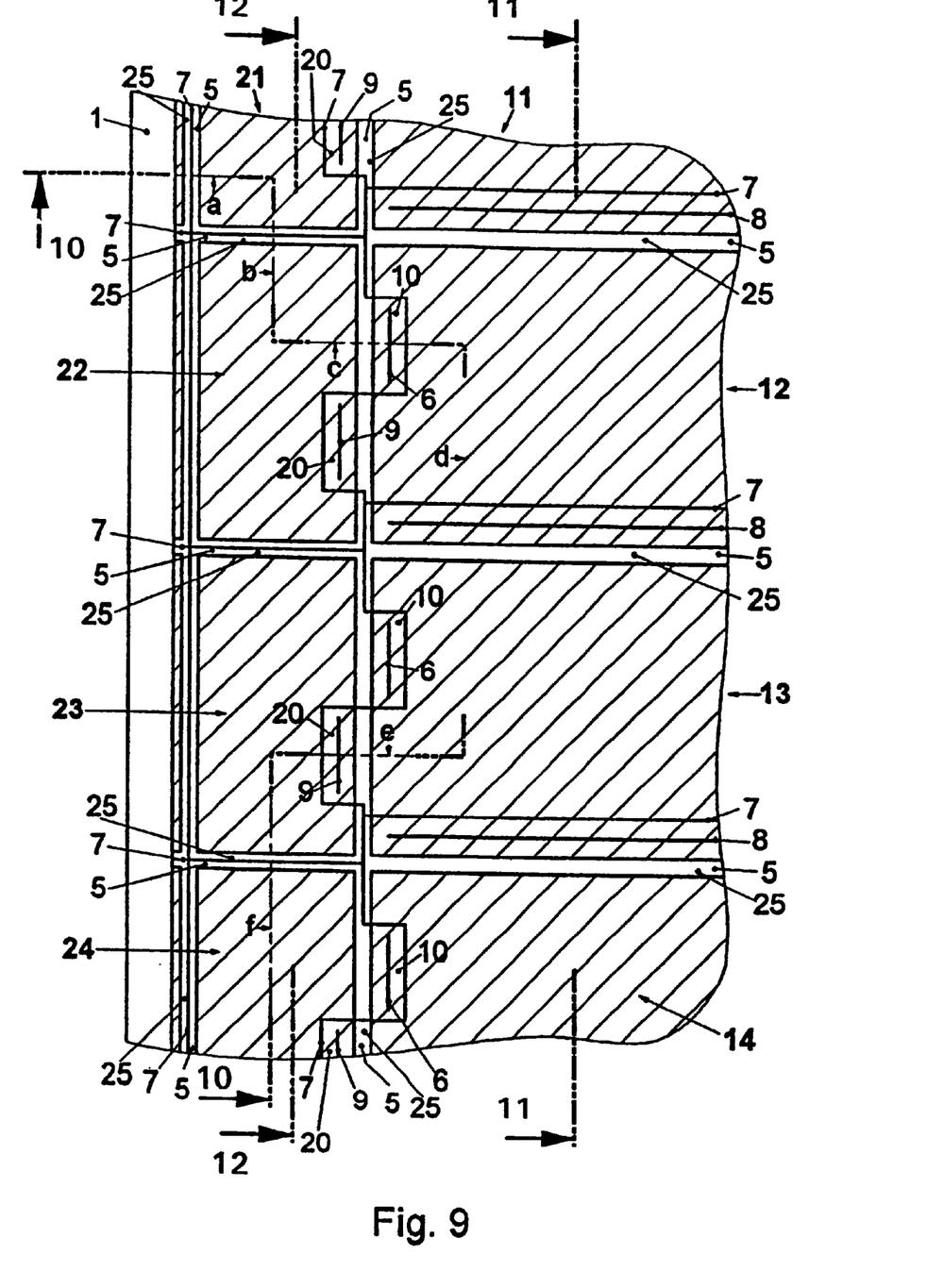
FIG. 9 shows part of the solar module with the reverse layer sequence in a plan view.

The plan views of FIG. 2 and 9 show a detail of a solar module according to the invention, with solar cells 11 [11], 12 [12], 13 [13] and 14 [14] and diodes 21 [21], 22 [22], 23 [23] and 24 [24]. (The number sequences and other terms in square brackets relate to the associations to the substrate technology depicted in FIGS. 9 to 15). One sees substantially the structuring of the particular front and back electrode layers. This is done by a first system of grooves 5 [5] and by a second system of grooves 7 [7]. For clarity's sake grooves 5 [7] are shown only as thick unbroken lines, unlike grooves 7 [5]. The back [front] electrode layers structured by grooves 7 [5] are obliquely hatched. The structuring of the photovoltaically active layer sequence necessary for this invention is shown by grooves 25 [25], which are congruent with or narrower than grooves 7 [5] of the back [front] electrode layer. For better representation, grooves 25 [25] are shown with the same size as grooves 7 [5].

Due to corresponding guidance of grooves 5 [7], projecting edge areas and recesses are formed in the front [back] electrode layers of the solar cells and diodes, resulting in overlap zones 10 [10] or 20 [20] in which said projecting edge areas come to lie under the superjacent edge zones of back [front] electrode layers. One also sees grooves 8 [8] as well as 6 [6] and 9 [9] which are for the electric contacting of overlapping electrode layers, said contacting being done through the photovoltaically active layer sequence located between the electrode layers (and not explicitly shown in FIG. 2 or 9), as indicated in detail by the sectional views of FIGS. 3 to 5 or 10 to 12.

Figure 4:
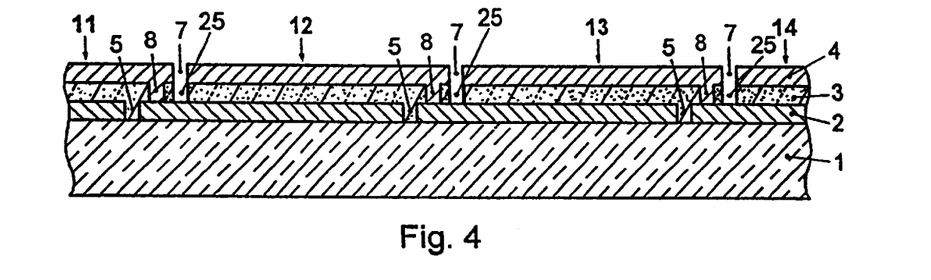
FIG. 4 shows a second cross section along line 4 of FIG. 2.
Figure 11:
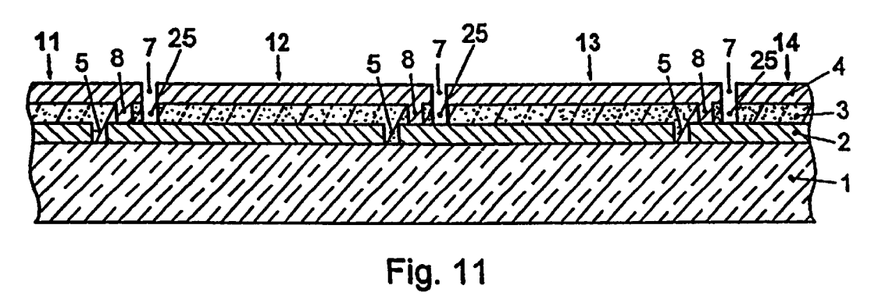
FIG. 11 shows a second cross section along line 11—11 of FIG. 9.

First, FIGS. 4 and 11 show sections only through solar cells 11 [11], 12 [12], 13 [13] and 14 [14]. The cells are connected in series in integrated fashion as usual. On substrate 1 [1], which is transparent in these embodiments, for example a glass wafer, front [back] electrode layers 2 [4] structured by grooves 5 [7] are first applied. Located thereon is continuous photovoltaically active layer sequence 3 [3] in which individual grooves 8 [8] are cut for the series connection.

Figure 3:
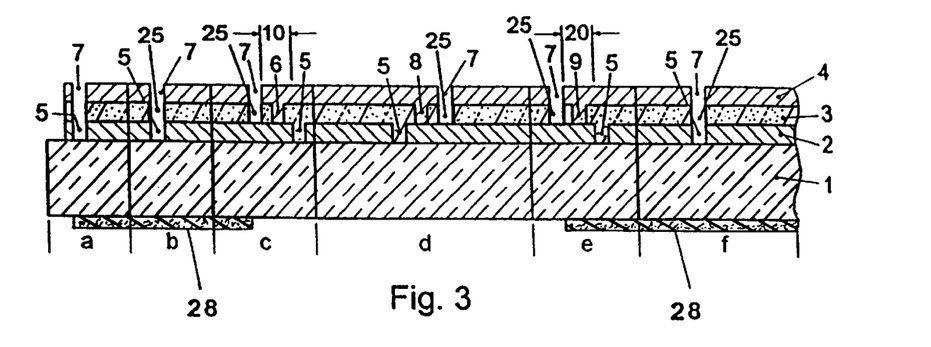
FIG. 3 shows a first cross section through said part of the solar module along line 3—3 of FIG. 2.
Figure 5:
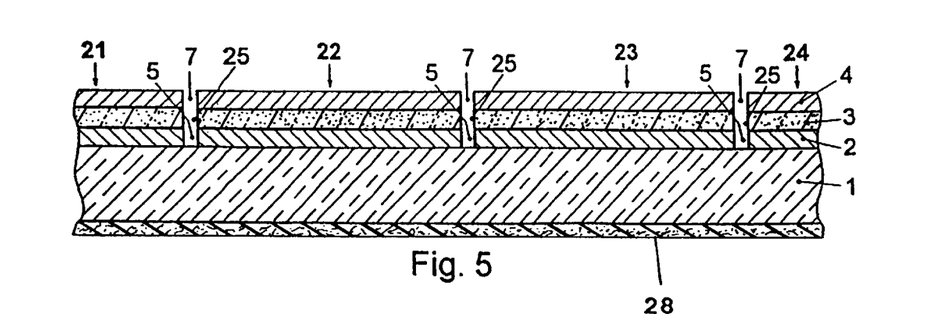
FIG. 5 shows a third cross section along line 5—5 of FIG. 2, FIGS. 6, 7 and 8 show three different versions of overlap zones.
Figure 6:
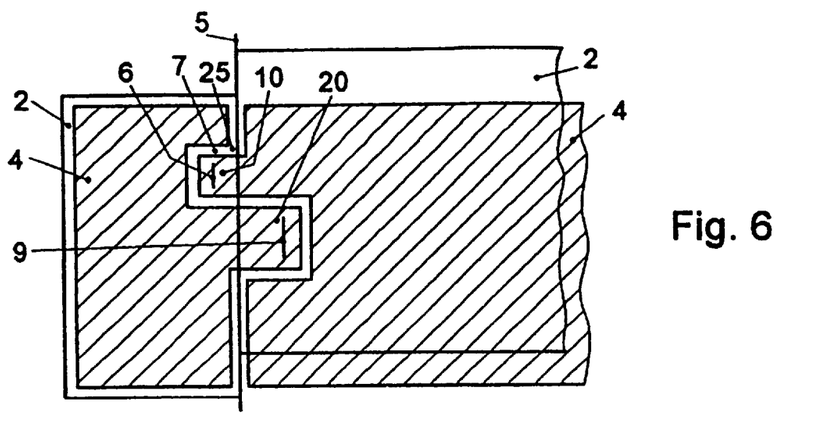

The photovoltaically active layer sequence is also separated in the area of grooves 7 [5] by grooves 25 [25]. Grooves 25 [25] must not be wider than grooves 7 [5] since the front and back electrode layers would otherwise be electrically short-circuited. In these embodiments, however, grooves 7 [5] are shown with the same width as grooves 25. Back [front] electrode layers 4 [2] separated by grooves 7 [5] are located on photovoltaically active layer sequence 3 [3], the material of back [front] electrode layers 4 [21 extending in grooves 8 [8] down to the surface of front [back] electrode layers 2 [4] and thus effecting the electric contacting necessary for the series connection. As seen by FIGS. 3 and 5, a lacquer or screen print mask 28 is applied to the exposed surface of substrate 1 over the diodes 21, 22, 23 and 24.

The photovoltaically active layer sequence can be executed for example as a p-i-n structure (in superstrate technology) or n-i-p structure (in substrate technology) based on amorphous silicon (the term "based on amorphous silicon" being intended to include all kinds of variants of single and multiple cell structures as well as amorphous alloys containing elements besides silicon (e.g. a-Si, a-SiGe, a-Si/a-Si, a-Si/a-SiGe, a-Si/a-Si/a-SiGe, a-Si/a-SiGe/a-SiGe, a-SiC/a-Si/a-SiGe). However, it can also contain nano- or microcrystalline silicon (nc- or μc-Si) or poly-c-silicon, cadmium sulfide (CdS) or cadmium telluride (CdTe) or be based on chalkopyrites, such as $CuInSe_2$ (CIS), $Cu(In,Ga)Se_2$ (CIGS) or $Cu(In,Ga)(Se,S)_2$. One can also use any other materials or layer sequences usual in solar cell technology which are suitable for producing and separating electric charges upon incidence of light. As front electrode layer 2 (2) one expediently uses a transparent conductive oxide layer, consisting for example of stannic oxide; as back electrode layer 4 [4] a highly electroconductive, for example nontransparent (opaque) metal layer which can also consist of a plurality of superimposed sublayers each of a different material.

Figure 12:
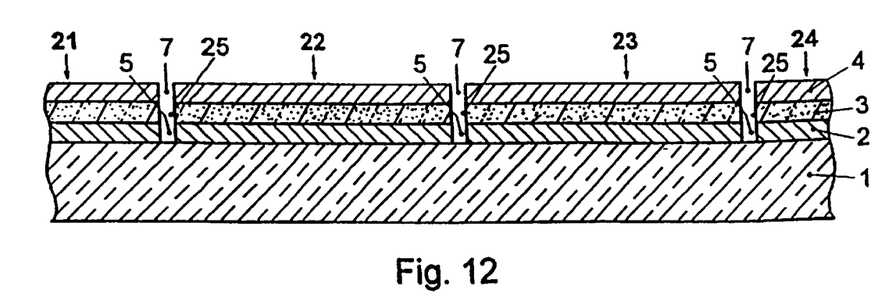
FIG. 12 shows a third cross section along line 12—12 of FIG. 9, FIGS. 13, 14 and 15 show three different versions of overlap zones
Figure 13:
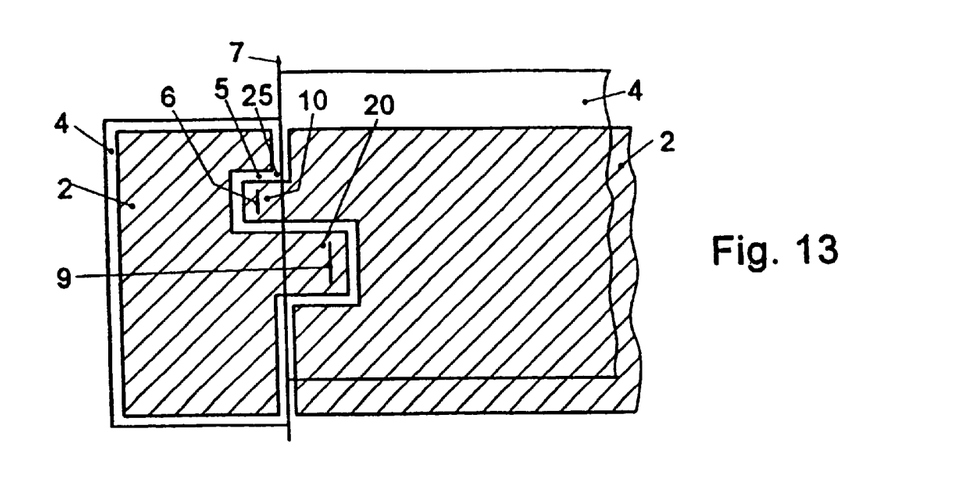

The section shown in FIGS. 5 and 12 extend through tandem mounted diodes 21 [21], 22 [22], 23 [23] and 24 [24]. Like the solar cells, the diodes consist of front electrode layers 2 [2], back electrode layers 4 [4] and the abovementioned intermediate photovoltaically active layer sequence 3 [3] separated into individual areas in grooves 25 [25]. The diodes separated by groove system 25 [25] in the areas of grooves 5 [7], which are no longer shown here only as lines as in FIG. 2 or 9 but with a certain width, and grooves 7 [5] located thereabove, which have the same width as grooves 5 [7] in FIG. 5 or 12, although this need not necessarily be the case. However, the width of grooves 5 [5], 25 [25] and 7 [7] must be selected such that the two electrode layers do not directly touch each other since they would otherwise be electrically short-circuited. In the embodiments of FIGS. 5 and 12, grooves 5 [5], 25 [25] and 7 [7] are executed with the same width but other designs not shown here are also possible. For example groove 7 [5] can be narrower than groove 25 [25] and groove 25 [25] can be narrower than groove 5 [7]. Thus, diodes 21 [21], 22 [22], 23 [23] and 24 [24] are electrically insulated from each other, at least in the shown cutting plane.

Figure 10:
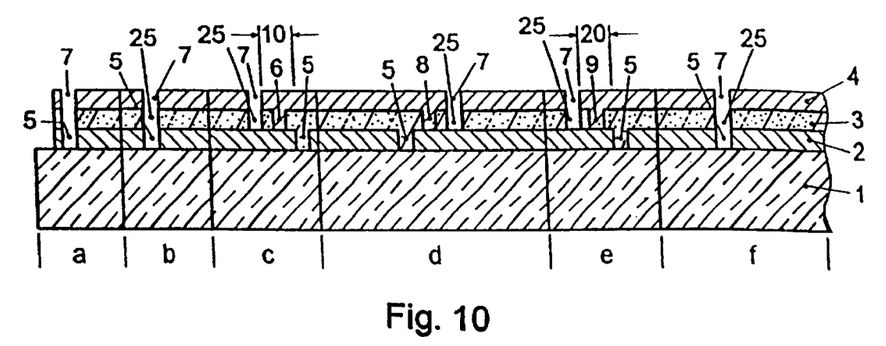
FIG. 10 shows a first cross section through said part of the solar module with the reverse layer sequence along line 10—10 of FIG. 9.

FIGS. 3 and 10 illustrate bent cross section according to line 3—3 of FIG. 2 or Line 10-10 of FIG. 9, respectively. These cross section views are divided into six portions a to f [a to f] each of which is straight. Designations are selected as in FIGS. 4 or 11 and 5 or 12. Portions b [b] and f [f] correspond to partial sections from FIG. 5 or 12, portion d [d] to a partial section from FIG. 4 or 11. Portions c [c] and e [e] go through overlap zones 10 [10] and 20 [20] respectively.

In the first overlap zones 10 [10], a projecting edge area of front [back] electrode layer 2 [4] of diode 22 [22] is located under an edge zone of back [front] electrode layer 4 [2] of assigned solar cell 12 [12]. Groove 6 [6] is present in which the material of back [front] electrode layer 4 [2] of solar cell 12 [12] extends through photovoltaically active layer sequence 3 [3] down to the surface of the subjacent edge area of front [back] electrode layer 2 [4] of diode 22 [22] so that said two electrode layers are electrically contacted with each other there. To avoid an electric short circuit between diode and adjacent cell, generated by the transverse conductivity of photovoltaically active layer sequence 3 [3], photovoltaically active layer sequence 3 [3] is separated by grooves 25 [25] which extend under grooves 7 [5] and have the same width as grooves 7 [5], although this need not necessarily be the case. However grooves 7 [5] must not be narrower than grooves 25 [25] since the front and back electrode layers would otherwise be electrically short-circuited.

A similar situation is found in sectional area e [e], where one sees overlap zone 20 [20] formed in this case by a projecting edge area of front [back] electrode layer 2 [4] of solar cell 13 [13] and the superjacent edge zone of back [front] electrode layer 4 [2] of diode 23 [23]. Groove 9 [9] in intermediate photovoltaically active layer sequence 3 [3] ensures contacting between said two layers, by means of the material of back [front] electrode layer 4 [2] of diode 23 [23] extending in said groove down to the surface of front [back] electrode layer 2 [4] of solar cell 13 [13], and grooves 25 [25] under grooves 7 [5] for separating photovoltaically active layer sequence 3 [3].

Figure 1:
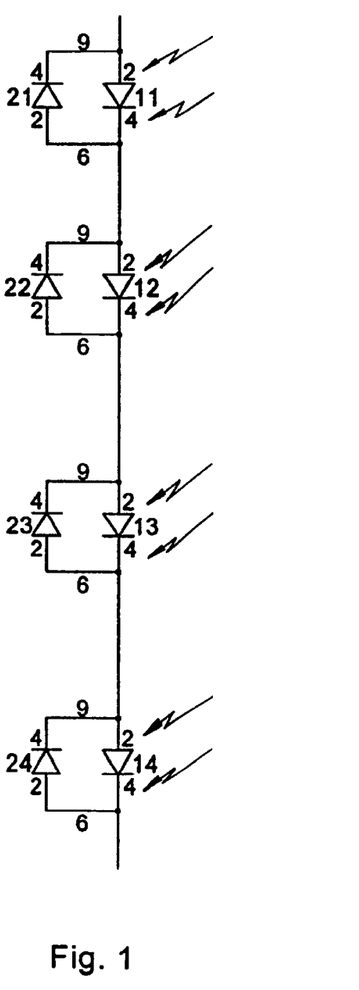
FIG. 1 shows an equivalent circuit diagram of part of the solar module.

The equivalent circuit diagram of FIG. 1 shows, along with solar cells 11 to 14 and diodes 21 to 24, corresponding front and back electrode layers 2, 4 which are contacted with each other in grooves 6 and 9 of said transition zones 10, 20 not shown here. The series connection of solar cells 11 to 14 and indirectly also of diodes 21 to 24 is effected via grooves 8, as mentioned above.

FIGS. 6 to 8 and 13 to 15 show variants in the design of transition zones 10 [10] and 20 [20]. While overlap zones 10 [10] and 20 [20] are formed by projecting edge areas and recesses in the front [back] electrode layers of the correlated solar cells and diodes in the variant depicted in FIG. 2 or 9, this is done for example according to FIG. 6 or 13 by projecting edge areas in back [front] electrode layers 4 [2]. These four embodiments therefore have in common that both one and the other of transition zones 10 [10] and 20 [20] of a diode and the adjacent solar cell are formed by projecting edge areas and recesses of the matching electrode layers, i.e. either the front [back] or the back [front] ones.

Figure 7:
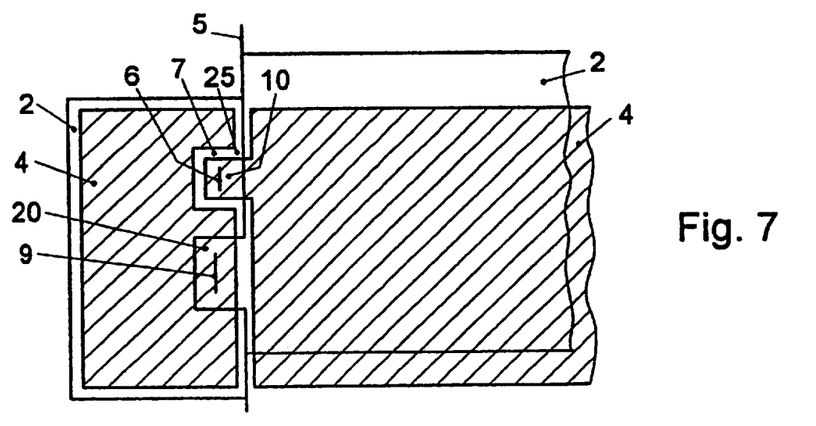
Figure 8:
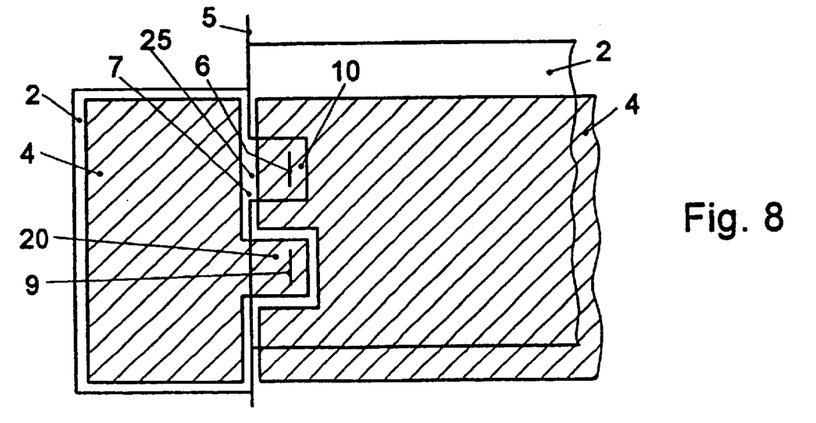
Figure 14:
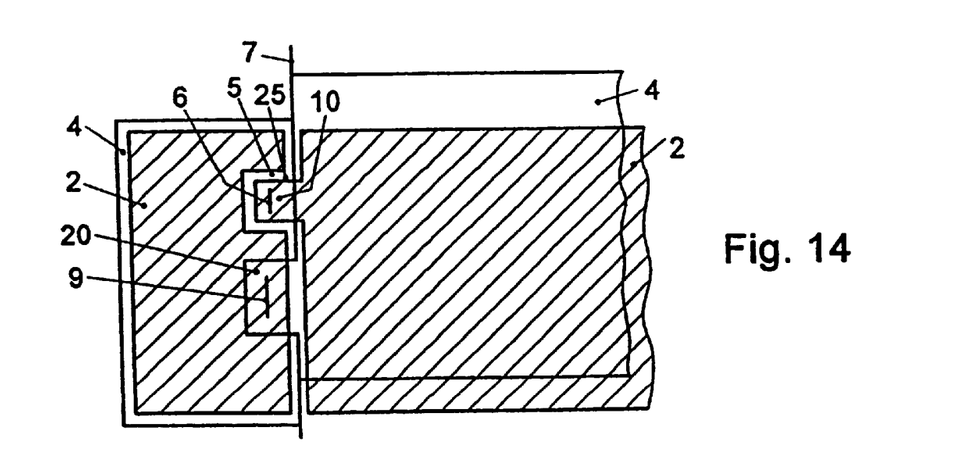
Figure 15:
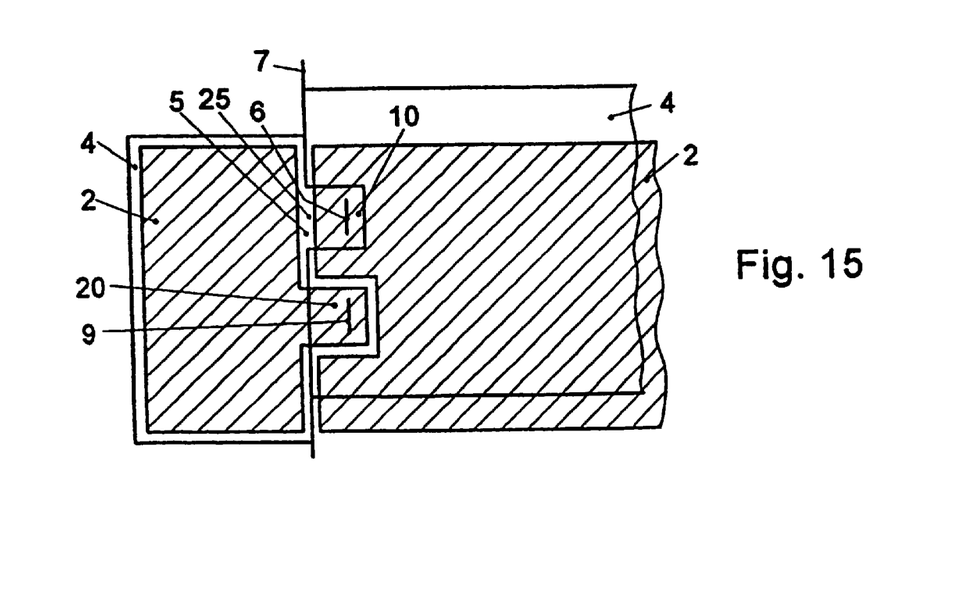

In the embodiment of FIG. 7 or 14, transition zone 10 [10] is formed by a projecting edge area of back [front] electrode layer 4 [2] of the solar cell, and transition zone 20 [20] by a projecting edge area of front [back] electrode layer 2 [4] likewise of the solar cell. According to FIG. 8 or 15 this is done by projecting edge areas of the front [back] and back [front] electrode layers of only the diode. These two variants thus have in common that one transition zone is formed by a projecting edge area and a recess in the front [back] electrode layers, and the other transition zone by a projecting edge area and a recess in the back [front] electrode layers of the involved diode and solar cell.

FIGS. 6 to 8 or 13 to 15 each show a pair consisting of a diode (on the left) and the assigned solar cell (on the right). As in FIG. 2 or 9, one sees front and back electrode layers 2 or 4 [2 or 4], the systems of grooves 5 and 7 [5 and 7] separating said layers, and the at least necessary two overlap zones 10 [10] and 20 [20] with grooves 6 [6] or 9 [9] present therein for contacting in the photovoltaically active layer sequence located between front and back electrode layers 2 or 4 [2 or 4], and grooves 25 [25] for separating said photovoltaically active layer sequence, which is again not explicitly shown here. Grooves 8 [8] for the series connection of adjacent solar cells are not shown either.

What is claimed is:

1. A solar cell module formed from integrated thin-film technology having a plurality of solar cells tandem mounted and series-connected on a common substrate and a plurality of diodes tandem mounted and series-connected on the common substrate, the diodes being parallel and adjacent to the solar cells, the solar cells and the diodes each having a front electrode layer, a back electrode layer and an intermediate photovoltaically active layer located between the front and back electrode layers, wherein:

the front electrode layers of the solar cells and the diodes are bonded to the substrate and the individual back electrode layers of the solar cells and the diodes are separated by grooves;

the front and back electrode layers of adjacent diodes are not directly electrically connected to each other;

a plurality of overlap zones are formed by projecting edge areas of the electrode layers of the solar cells or diodes wherein:

each overlap zone of a solar cell electrode layer engages in a recess in the corresponding electrode layer of the adjacent diode: and each overlap zone of a diode electrode layer engages in a recess in the corresponding electrode layer of the adjacent solar cell so that:

the overlap zones formed by the front electrode layers overlap subadjacent zones of the back electrode layers of the adjacent diode or solar cell that the front electrode layer overlap zones engage; or the overlap zones formed by the back electrode layers overlap superadjacent zones of the front electrode layers of the adjacent diode or solar cell that the back electrode overlap zones engage;

each diode is connected to a reverse bias orientation to the adjacent solar cell in at least two overlap zones, wherein:

in a first one of the overlap zones, the front electrode layer of the diode is electrically connected to the back electrode of the adjacent solar cell; and in a second one of the overlap zones, the back electrode layer of the diode is electrically connected to the front electrode layer of the adjacent solar cell; and the photovoltaically active layers forming of the individual solar cells and diodes are separated from each other by grooves that are in registration with the grooves that separate the back electrode layers.

2. The solar cell module according to claim 1, wherein, both of the overlap zones of at least one of the diodes and the adjacent solar cell are formed by projecting edge areas and recesses of the matching electrode layer.

3. The solar cell module according to claim 2, wherein the electric contact between the front and back electrode layers in the overlap zones is effected through openings in the photovoltaically active layers.

4. The solar cell module according to claim 1, wherein, for at least one of the diodes and the adjacent said solar cell, one of the overlap zones is formed by a projecting edge area and a recess of the front electrode layers of the diode and the adjacent solar cell, and the second one of the overlap zones is formed by a projecting edge area and a recess of the back electrode layers of the diode and the adjacent solar cell.

5. The solar cell module according to claim 4, wherein the electric contact between the front and back electrode layers in the overlap zones is effected through openings in the photovoltaically active layers.

6. The solar cell module according to claim 1, wherein the electric contacts between the front and back electrode layers in the overlap zones is effected through openings in the photovoltaically active layers.

7. The solar cell module according to claim 6, wherein the electric contacts through the openings in the photovoltaically active layer are established by segments of the back electrode layers that extend down to the surface of the front electrode layers.

8. The solar cell module according to claim 1, wherein the diodes are shielded from illumination by an opaque cover.

9. The solar cell module of claim 1, wherein the grooves separating the back electrode layers and the grooves separating the photovoltaically active layers are the same width.

10. A solar cell module formed from integrated thin-film technology having a plurality of solar cells tandem mounted and series connected on a common substrate and a plurality of diodes tandem mounted and series-connected on the common substrate, the diodes being parallel and adjacent to the solar cells, the solar cells and the diodes each having a front electrode layer, a back electrode layer and an intermediate photovoltaically active layer located between the front and back electrode layers, wherein:

the back electrode layers of the solar cells and the diodes are bonded to the substrate and the individual front electrode layers of the solar cells and the diodes are separated from each other by grooves;

the front and back electrode layers of adjacent diodes are not directly electrically connected to each other;

a plurality of overlap zones are formed by projecting edge areas of the electrode layers of the solar cells or diodes wherein:

each overlap zone of a solar cell electrode layer engages in a recess in the corresponding electrode layer of the adjacent diode: and each overlap zone of a diode electrode layer engages in a recess in the corresponding electrode layer of the adjacent solar cell so that:

the overlap zones formed by the front electrode layers overlap subadjacent zones of the back electrode layers of the adjacent diode or solar cell that the front electrode layer overlap zones engage; or the overlap zones formed by the back electrodes overlap superadjacent zones of the front electrode layers of the adjacent diode or solar cell that the back electrode overlap zones engage;

each diode is connected to a reverse bias orientation to the adjacent solar cell in at least two overlap zones, wherein:

in a first one of the overlap zones, the front electrode layer of the diode is electrically connected to the back electrode of the adjacent solar cell; and in a second one of the overlap zones, the back electrode layer of the diode is electrically connected to the front electrode layer of the adjacent solar cell; and the photovoltaically active layers forming of the individual solar cells and diodes are separated from each other by grooves that are in registration with the grooves that separate the front electrode layers.

11. The solar cell module according to claim 10, wherein, both of the overlap zones of at least one of the diodes and the adjacent said solar cell are formed by projecting edge areas and recesses of the matching electrode layer.

12. The solar cell module according to claim 11, wherein the electric contact between the front and back electrode layers in the overlap zones is effected through openings in the photovoltaically active layers.

13. The solar cell module according to claim 10, wherein, for at least one of the diodes and the adjacent solar cell, one of the overlap zones is formed by a projecting edge area and a recess of the front electrode layers of said diode and said adjacent solar cell, and the second one of the overlap zones is formed by a projecting edge area and a recess of the back electrode layers of the diode and the adjacent solar cell.

14. The solar cell module according to claim 13, wherein the electric contact between the front and back electrode layers in the overlap zones is effected through openings in the photovoltaically active layers.

15. The solar cell module according to claim 10, wherein the electric contacts between the front and back electrode layers in the overlap zones is effected through openings in the photovoltaically active layers.

16. The solar cell module according to claim 15, wherein the electric contacts through the openings in the photovoltaically active layer are established by segments of the front electrode layers that extend down to the surface of the back electrode layers.

17. The solar cell module according to claim 10, wherein the diodes are shielded from illumination by an opaque cover.

18. The solar cell module of claim 10, wherein the grooves separating the front electrode layers and the grooves separating the photovoltaically active layers are the same width.

* * * * *